United States Patent [19]

Kornrumpf et al.

[11] 4,318,165
[45] Mar. 2, 1982

[54] RESONANT-FLYBACK POWER SUPPLY WITH FILAMENT WINDING FOR MAGNETRON AND THE LIKE LOADS

[75] Inventors: William P. Kornrumpf; John N. Park, both of Schenectady, N.Y.; De Y. Chen, Blacksburg, Va.

[73] Assignee: General Electric Company, Schenectady, N.Y.

[21] Appl. No.: 141,907

[22] Filed: Apr. 21, 1980

[51] Int. Cl.³ .................. H02P 13/18; H05B 6/68
[52] U.S. Cl. ...................... 363/21; 219/10.55 B; 328/270; 363/56
[58] Field of Search .......... 219/10.55 B; 363/21, 363/28, 56, 80, 97; 328/270

[56] References Cited

U.S. PATENT DOCUMENTS

| | | | |
|---|---|---|---|
| 3,562,623 | 2/1971 | Farnsworth | 363/20 |
| 3,564,393 | 2/1971 | Williamson | 363/21 |
| 3,973,165 | 8/1976 | Hester | 219/10.55 B |
| 4,142,082 | 2/1979 | Israel | 219/10.55 B |
| 4,228,493 | 10/1980 | Sartre et al. | 363/21 |
| 4,236,187 | 11/1980 | Mochizuki et al. | 363/56 |

FOREIGN PATENT DOCUMENTS 52-57702 12/1977 Japan ............. 219/10.55 B

*Primary Examiner*—William H. Beha, Jr.
*Attorney, Agent, or Firm*—Geoffrey H. Krauss; James C. Davis, Jr.; Marvin Snyder

[57] ABSTRACT

A filament winding forms a part of the step-up transformer in a flyback-type high-frequency, high-voltage power supply for supplying filament heating energy, in addition to the anode potential supplied by a secondary winding of the transformer, to a magnetron microwave power generator, which is a self-rectifying load. The voltage across the transformer primary winding, and the current flowing through a controllable current path in a switching device connecting the series with that primary winding, are both monitored and compared to reference voltage and current values for establishing the conduction time interval of the switching device to provide active control of the power input to the load.

14 Claims, 5 Drawing Figures

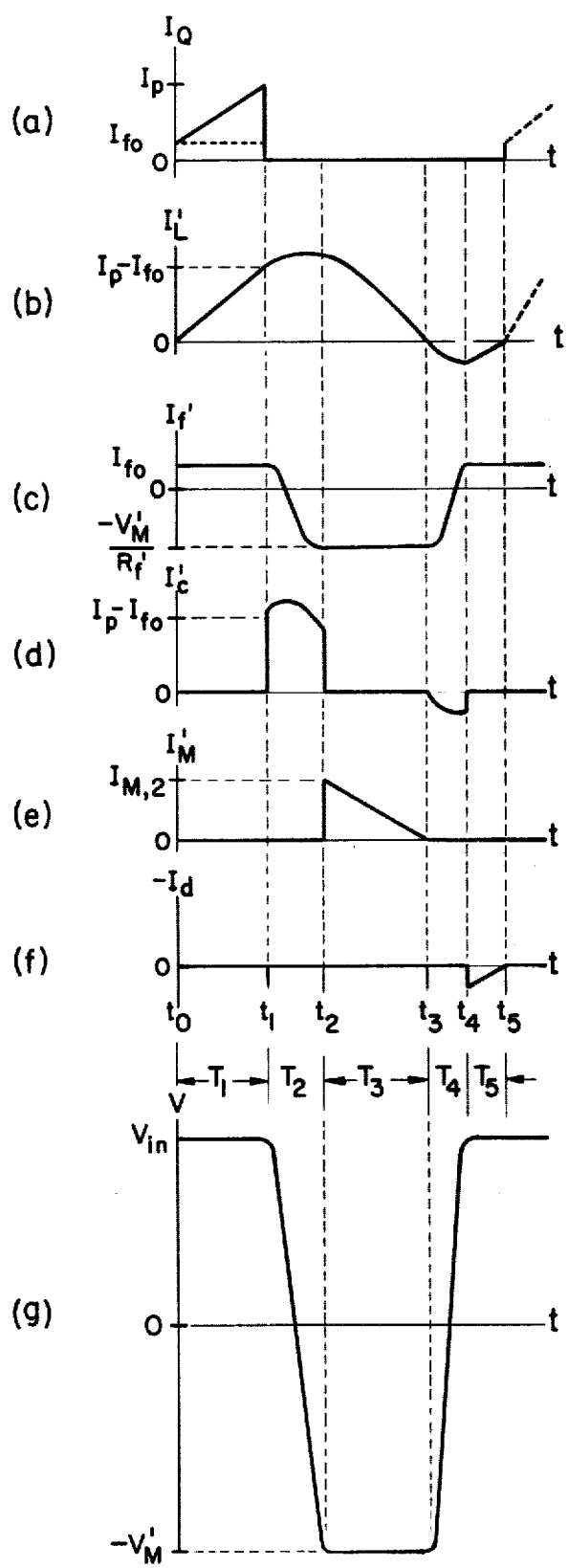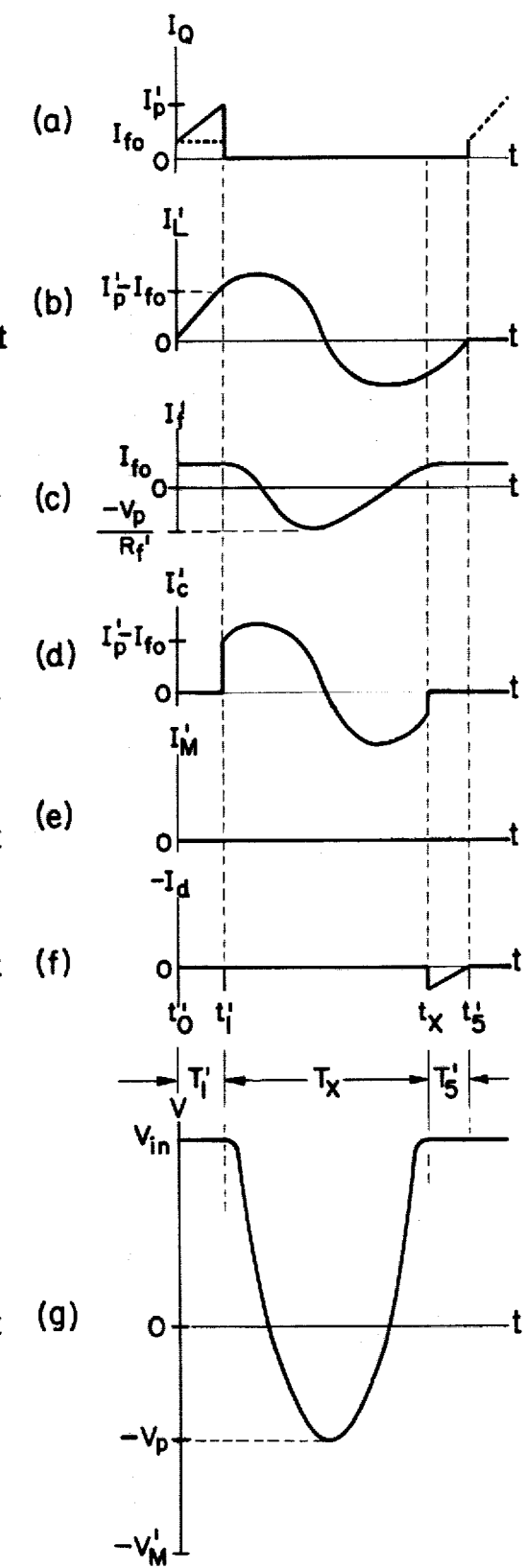

RESONANT-FLYBACK POWER SUPPLY WITH FILAMENT WINDING FOR MAGNETRON AND THE LIKE LOADS

BACKGROUND OF THE INVENTION

The present invention concerns power supplies and, more particularly, an improved resonant power supply of the flyback type, having a separate transformer winding for supplying filament heating energy to magnetron and the like load, and having circuitry for controlling power input to the load.

In the co-pending application, U.S. patent application Ser. No. 086,826, filed Oct. 22, 1979, assigned to the assignee of the present invention and incorporated here in its entirety by reference, the use of a flyback-type high-frequency, high-voltage power supply was described for energizing a self-rectifying load, such as a magnetron microwave power generator for a microwave oven and the like. In that application, a switching device, e.g. the collector-emitter circuit of a power switching transistor, is connected in series with the primary winding of a transformer to provide pulses of energy to a resonant circuit formed at the transformer secondary winding and including the electrical capacitance of the load connected across the transformer winding inductance. The load conducts only for unipolar excitation exceeding a minimum magnitude. A clamping diode and a snubber network are connected in electrical parallel across the switching device and the transformer primary winding, to protect the switching device from reverse voltage effects. This type of high-voltage power supply does not require a high-voltage rectifier; however, a separate power transformer is required to provide filament heating energy to the magnetron load. The filament transformer must be insulated, whereby the secondary winding thereof can be at a potential differing from the potential of the primary winding by several thousand volts. This insulation requirement, when considered with the requirement that the filament transformer be energized by residential power mains voltage (a 120 VAC, 60 Hz. waveform) requires that the filament transformer be of relatively great weight and volume and relatively high cost. It is therefore desirable to provide an improved power supply for energizing a magnetron, and the like loads, which does not require a separate filament transformer. It is also highly desirable to provide means for protecting the power switching device against excessive currents, while providing active power control of the load, whereby the average power consumed by the load (and the average microwave power produced by a magnetron load, specifically) is controllable.

BRIEF SUMMARY OF THE INVENTION

In accordance with the invention, a power supply for energizing a magnetron and the like self-rectifying loads, through which a current flows only when a predetermined minimum voltage of a single polarity is exceeded thereacross, and utilizing a transformer having a primary winding in series between a source of operating potential and a controlled-current path through a switching device and a secondary winding, connected across the load, includes a third transformer winding for supplying heating energy to a filament electrode of a load magnetron and the like. The filament resistance appears in parallel with an electrical capacitance, across the inductance of the primary winding of the transformer, with the capacitance having a magnitude sufficient to resonate the transformer winding at a frequency greater than the frequency of a train of sequential conducted-current path enabling pulses applied to a controlling element of the switching device. The instantaneous value of the current flowing through the switching device is sampled and compared to a reference current in a first comparator, having an output controlling the conduction time interval of the switching transistor. In this manner, the reference current value is utilized to limit the peak instantaneous switching device current to a safe value. A second comparator monitors the voltage across the transformer primary winding, which is related to the instantaneous load voltage, and compares the winding voltage with a reference voltage to control power supply output voltage. The output voltage may thus be lowered to prevent effective load energization when load filament-heating-only generation is desired. Both comparator outputs control a switching device drive circuit, also receiving signals varying the drive circuit duty cycle to provide effective power control of the load.

Accordingly, it is an object of the present invention to provide a novel improved resonant power supply for controllably providing filament power to a load and for energizing the load to consume power only if a minimum voltage thereacross is exceeded.

This and other objects of the present invention will become apparent upon consideration of the following detailed description, when taken in conjunction with the drawings.

BRIEF DESCRIPTION OF THE DRAWINGS

FIGS. 1b and 1c are sets of inter-related current and voltage waveforms in the simplified circuit of FIG. 1a, and useful in understanding operational principles of the present invention in the load-conductive and load-nonconductive cases, respectively.

DETAILED DESCRIPTION OF THE INVENTION

Figure 1:
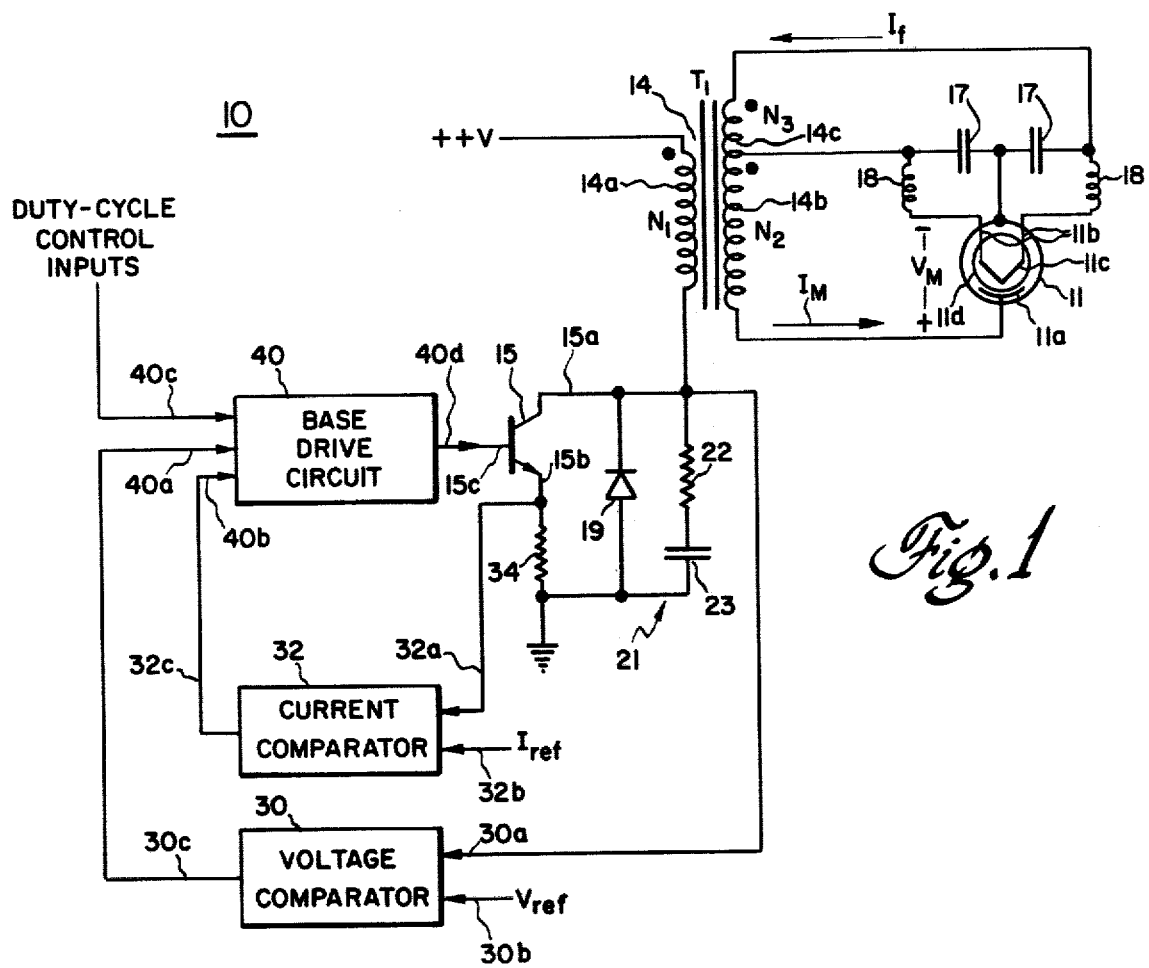
FIG. 1 is a schematic block diagram of a microwave oven magnetron and of an improved power supply for energization thereof, in accordance with the principles of the present invention.

Referring initially to FIG. 1, improved power supply 10 for energizing a load, such as microwave oven magnetron 11 and the like, provides a voltage $V_M$ across the load magnetron. Voltage $V_M$ will, when the magnetron conducts, have a positive polarity at a magnetron anode 11a, which may be referenced to electrical ground potential, and will have a negative polarity at one of a pair of leads 11b of a magnetron filament 11c serving to heat a magnetron cathode 11d for emission of electrons therefrom. As is well known, when filament 11c is energized and an electrical potential, of a magnitude greater than some minimum potential, typically on the order of three to four kilovolts (kV.), is applied between anode 11a cathode 11d, the magnetron draws anode current $I_M$ and produces microwave power which is output from generator 11 to perform a heating function, e.g. cooking food and the like, in a microwave oven and similar apparatus. As described and claimed in co-pending application Ser. No. 086,826, a primary winding 14a, of a high-voltage transformer 14, is connected between a source of operating potential, of magnitude ++V (as may be obtained by rectification of the power mains voltage) and a controlled-current-flow circuit of a switching device 15. A first secondary winding 14b connects between load magnetron anode 11a and one of load filament leads 11b, typically via one of filament bypass capacitors 17 and a series radio-frequency-interference-suppressing inductance 18. Switching device 15 is operated to draw current through primary winding 14a for an initial time interval, during each of a sequential plurality of operational cycles. At the end of the initial time interval, switching device 15 is turned off and current then flowing through primary winding 14a is transferred to secondary winding 14b. The inductance of the secondary winding appears in parallel with a capacitance (attributable to the capacitance of elements 17 and to the load capacitance), which inductance and capacitance form a resonant circuit having a frequency greater than the frequency at which switching device 15 is operated. Typically, this switching device frequency is about 2 to 3 orders of magnitude greater than the line frequency, e.g. between about 20 kHz. and about 100 kHz. Use of these relatively high frequencies results in a reduction of weight and size of transformer 14. The resonance effect in this flyback circuit provides cyclic pulses of high voltage operating potential $V_M$ across magnetron 11. A clamping diode 19, and a snubbing network 21, comprised of a resistance 22 in series with an electrical capacitance 23, are connected in parallel with the controlled-current-flow circuit, from a collector electrode 15a to an emitter electrode 15b, of a transistor switching device 15. Diode 19 conducts during a latter portion of the cycle to prevent reverse conduction in device 15, and the damage thereto possible from such reverse conduction.

In accordance with one aspect of the present invention, transformer 14 includes another secondary winding 14c, providing operating potential to load filament 11c. As illustrated, load magnetron 11 is of the type having the cathode 11d thereof connected to one filament lead 11b, whereby the negative polarity termination of transformer high-voltage secondary winding 14b and one end of filament winding 14c are common. It should be understood that the filament winding may be a separate winding, if a magnetron having a cathode connection separate from the filament connections thereof is utilized.

In order to provide filament heating energy while the apparatus is energized, even if the anode voltage of the load is reduced to prevent substantial microwave power generation therefrom and thus provide active power control of that magnetron output power, the conduction time interval of device 15 is varied. To protect the switching device against excessive flow of current in the controlled-current-flow circuit, the transformer primary winding voltage and current are monitored. Specifically, a first comparator means 30 has a first input connected to the junction between the switching device collector 15a and one end of transformer primary winding 14a. A second voltage comparator input 30b receives a reference voltage of magnitude $V_{ref}$. A voltage comparator output 30c is energized only when the magnitude of the voltage at comparator input 30a exceeds the magnitude of the reference voltage present at input 30b. A second comparator 32 monitors the flow of current through the collector-emitter circuit of switching transistor 15; this may be facilitated by an emitter resistor 34 which provides a voltage thereacross substantially proportional to the current flowing from the emitter of device 15. The emitter resistor voltage is connected to a first input 32a of the current comparator 32, which also receives a reference current $I_{ref}$ signal at a second input 32b thereof. It should be understood that second input 32b may receive either a current or voltage, of the proper reference magnitude, for comparison against the voltage across the emitter-current-related voltage at input 32a; the choice of an electrical current or voltage at input 32b is dependent upon the particular type of comparator 32 utilized. Current comparator output 32c is energized only if the magnitude of the signal at comparator input 32a exceeds the magnitude of the reference signal at comparator input 32b. Each of comparator outputs 30c and 32c are connected to an associated input 40a and 40b, respectively, of a base drive circuit means 40, which also receives at least one duty-cycle control input signal at another input 40c thereof. Base drive circuit 40 provides an output 40d, connected to a control electrode, e.g. base electrode 15c, of the switching device, for controlling switching device current flow and the time intervals thereof, in accordance with the magnitude of the signal at duty-cycle control input 40c. Base drive circuit 40 terminates base drive to switching device control electrode 15c if comparator output 32c is energized (indicative of over-current conditions, which may harmfully stress switching device 15). Energization of over-voltage comparator output 30c will reduce the time duration during which device 15 is "on", during the next operating cycle, to reduce peak collector voltage thereat.

Figure 1A:
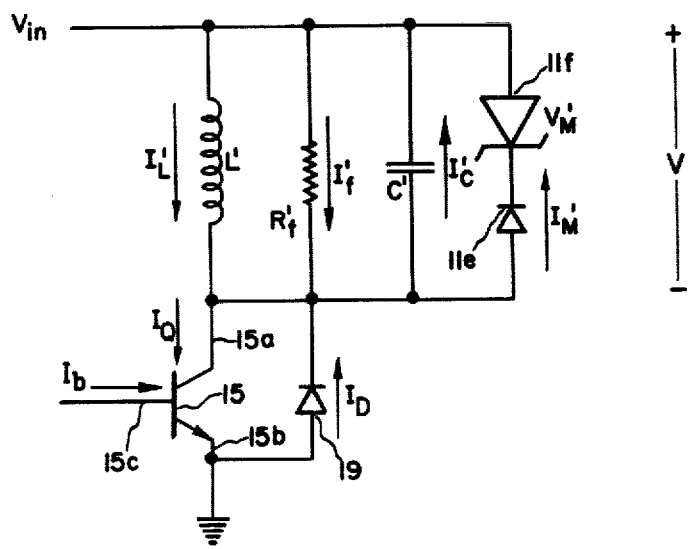
FIG. 1a is a schematic diagram of the equivalent circuit of a portion of the improved power supply of FIG. 1 and useful in understanding the operation thereof.

Referring now to FIGS. 1a–1c, operation of improved power supply 10, to provide filament and anode operating potentials for a magnetron load 11, may be best understood by considering the equivalent circuit (FIG. 1a) of the load magnetron, as reflected to the transformer primary winding 14a. The equivalent circuit includes the transformer mutual inductance L' connected between an input potential source, of magnitude $V_{in}$, and switching device 15. In parallel with mutual inductance L' is the equivalent capacitance C', of magnitude equal to the resonating capacitance C (across secondary winding 14b) times the square of the ratio of the number $N_2$ of turns of the secondary winding 14b to the number $N_1$ of turns of the primary winding 14a, i.e. $C' = C(N_2/N_1)^2$ plus any other capacitance across primary winding 14a. An equivalent filament resistance $R_f'$ is also in parallel with mutual inductance L'; the magnitude of the reflected filament resistance is equal to the actual filament resistance $R_f$ times the square of the ratio of the number $N_1$ of turns of the primary winding 14a to the number $N_3$ of turns of the filament secondary winding 14c, i.e. $R_f' = R_f(N_1/N_3)^2$. As current flows through the magnetron only if the magnetron anode is positive with respect to the magnetron cathode, and, further, only if the voltage from anode to cathode exceeds the minimum magnetron voltage, the magnetron appears to be a series circuit including an ideal diode 11e having its anode connected to the magnetron anode and having its cathode connected to the anode of a high-voltage zener diode 11f. The zener voltage is equal to the magnetron conduction voltage $V_M$. When reflected from secondary winding 14b to primary winding 14a, the equivalent magnetron zener voltage $V_M'$ is equal to the magnetron conduction voltage times the step-down ratio of the numbers of turns of the primary winding 14a to the number of turns of the secondary winding 14b, i.e. $V_M' = V_M(N_1/N_2)$.

In operation, initially consider the condition where the primary winding voltage V will exceed the minimum load conduction voltage $V_M'$, as reflected at the primary winding, whereby the load conducts during a portion of each power supply operating cycle. If the input voltage $V_{in}$ is always equal to, or slightly less than, the reflected magnetron voltage, whereby the actual magnetron anode voltage $V_M$ is equal to $V_{in}(N_2/N_1)$, then the magnetron will conduct during at least one portion of each cycle. This condition is illustrated in the interrelated timing diagrams of FIG. 1b.

Prior to some time $t_o$, at which a cycle starts, equivalent capacitance C' has been charged to the input voltage $V_{in}$. There is essentially no flow of current $I_L'$ through mutual inductance L' and, if the driving current $I_b$ into the base electrode of switching device 15 is sufficiently small, transistor collector current $I_Q$ is substantially equal to the switching device collector leakage current whereby equivalent filament resistance current $I_f'$ and equivalent capacitance current $I_C'$ are both substantially equal to zero.

At time $t_o$, base drive circuit 40 (FIG. 1) provides a current $I_b$ of sufficient magnitude into base electrode 15c to drive switching transistor 15 into the heavily-conducting condition, whereby a substantially short circuit appears between collector electrode 15a and emitter electrode 15b. The voltage across transformer primary winding 14a, and therefore across inductance L', is substantially the entire operating voltage $V_{in}$ (neglecting the relatively small saturation voltage drop $V_{sat}$ between collector and emitter electrodes 15a and 15b, respectively, of device 15). An equivalent filament current $I_f'$, at an initial magnitude $I_{fo} = V_{in}/R_f'$, flows through the equivalent filament resistance $R_f'$; the actual filament current is given by $I_f = I_f'/(N_1/N_3)$. See waveforms (a) and (c) of FIG. 1b. In a first time interval $T_1$, between initial time $t_o$ and a time $t_1$ (at which base drive circuit 40 removes input current $I_b$ and removes device 15 from saturation) mutual inductance current $I_L'$ linearly increases (waveform (b) of FIG. 1b) and the transistor collector current $I_q$ increases by a like amount (waveform (a) of FIG. 1b) until the collector current reaches a peak, of magnitude $I_p$. Accordingly, the peak current flowing through mutual inductance L' reaches a magnitude of $(I_p-I_{fo})$, at the end of time interval $T_1$. During time interval $T_1$, voltage $V_{C'}$, across reflected resonating capacitance C', remains substantially equal to the operating potential $V_{in}$, and capacitance current $I_c'$, load current $I_M'$ and catch diode current $I_D$ respectively shown in waveforms (d), (e) and (f) of FIG. 1b) are all substantially equal to zero. The magnitude of voltage V is equal to $V_{in}$ (waveform (g) of FIG. 1b) and the self-rectifying diode 11e of the load is reversed biased, i.e. the load does not conduct.

At time $t_1$, base drive circuit means 40 turns off switching device 15 and the collector current $I_Q$ thereof falls to zero, as device 15 is now in the open, or non-conducting, condition. The energy stored in mutual inductance L' is now transferred to secondary windings 14b and 14c, as the mutual inductance current $I_L'$ cannot abruptly change. As the load is not conducting, the mutual inductance current must flow through the equivalent filament resistance $R_f'$ and the reflected reonating capacitance C'. Thus, at time $t_1$, the mutual inductance current $I_L'$, is equal to $(I_p-I_{fo})$; the equivalent filament resistance current $I_f'$ is, at instant $t_1$, equal to the previously established magnitude $I_{fo}$, whereby the effective capacitance current $I_C'$ must abruptly rise to a peak value of $(I_p-I_{fo})$. During an immediately-subsequent time interval $T_2$, the current $I_C'$ flowing into effective capacitance C' charges the capacitance toward a primary winding voltage V which will exceed, in magnitude, the magnitude of the equivalent load zener voltage $V_M'$. Voltage V thus equals the load conduction voltage, of polarity and magnitude $(-V_M')$ at time $t_2$, whereupon the load (magnetron 11) conducts, and the load current $I_M'$ abruptly increases to some initial value $I_{M,2}$ (waveform (e) of FIG. 1b). Thus, during time interval $T_2$, the voltage V across equivalent filament resistance $R_f'$ decreases to zero and then increases, with opposite polarity, to the value, at time $t_2$, of $-V_M'$ volts, whereby the equivalent filament resistance current $I_f' = (-V_M'/R_f')$ at time $t_2$ (waveform (c) of FIG. 1b).

During a third time interval $T_3$, the load voltage is at least equal to the minimum load conduction voltage, equivalent load diode 11e conducts and the primary voltage V is clamped at the equivalent load zener voltage of magnitude $V_M'$ and negative polarity (waveform (g) of FIG. 1b). The equivalent magnetron current $I_M'$ (waveform (e)) decreases, reaching essentially zero magnitude at time $t_3$, at the end of load conductance time interval $T_3$. The equivalent capacitance current $I_C'$, which abruptly fell to essentially zero magnitude at time $t_2$, continues at essentially zero magnitude during the entirety of the time interval $T_3$. The equivalent filament current $I_f'$ remains at a substantially constant value (equal to $-V_M'/R_f'$) during time interval $T_3$, as the voltage V thereacross remains equal to $(-V_M')$.

At time $t_3$, the energy stored in mutual inductance L' falls to zero and mutual inductance current $I_L'$ is zero. Magnetron current $I_M'$ is also essentially of zero magnitude and the magnetron ceases to conduct. The primary voltage V is still equal to the equivalent magnetron voltage $-V_M'$, causing capacitance C to pump charge back into mutual inductance L', whereby the mutual inductance current $I_L'$ obtains a negative polarity and flows in direction opposite the direction of arrow $I_L'$, during the time interval $T_4$. Voltage V rises toward zero volts and, because the mutual inductance current must remain continuous, the effective capacitance and mutual inductance "ring", causing capacitance C' to sinusoidally charge, such that voltage V becomes equal, at time $t_4$, to the input voltage $V_{in}$. The voltage across the switching device collector-emitter circuit decreases from a maximum voltage, approximately equal to $V_M' + V_{in}$, to essentially zero volts at time $t_4$, while the filament current $I_f'$ follows the shape of voltage V and has an amplitude linearly related thereto, by the constant $R_f'$. Filament current $I_f'$ thus returns to magnitude $I_{fo}$, at time $t_4$. The energy stored in mutual inductance L', by the discharge of capacitance C' during time interval $T_4$, now causes the switching device collector-emitter voltage to reverse polarity, whereupon catching diode 19 conducts and diode current $I_D$ (waveform (f) of FIG. 1b) flows for a time interval $T_5$. At the end of this time interval, i.e. at time $t_5$, a cycle is complete and all of the waveforms have returned to their starting values, whereby the circuit will commence another operational cycle upon reapplication of base drive $I_b$ to switching device 15, from base drive circuit 40.

It will be seen that, in the operational-load case illustrated in FIG. 1b, the magnetron load receives both anode and filament operating current from the secondary windings of transformer 14. Specifically, energy delivered to the filament is the sum of the energy delivered thereto during each of time intervals $T_1$-$T_5$. During the first time interval $T_1$, the amount of filament energy $E_1$ is:

$$E_1 = (V_{in} - V_{sat})^2 (I_p/(V_{in} - V_{sat}) - 1/R_f)(L'/R_f),$$

where $V_{sat}$ is the collector-emitter saturation voltage of switching device 15. During the second time interval $T_2$, the amount of filament energy $E_2$ is:

$$E_2 = (T_2/R_f)(V_{in}V_{sat} + (V_{in} - V_{sat})^2/3)$$

and the approximate duration of time interval $T_2$ is given by $$T_2 = C'(V_{in} - V_{sat} + V_M')/(I_p - V_{in}/R_f).$$

The energy $E_3$ delivered to the equivalent filament resistance during the third time interval $T_3$ is:

$$E_3 = T_3 V_M 2'/R_f$$

and the filament energy $E_4$ during the fourth time interval $T_4$ is:

$$E_4 = (V_M'^2/R_f)\left(T_4/2 + \left(\sqrt{L'C'}/4\right) \sin\left(2T_4/\sqrt{L'C'}\right)\right).$$

Finally, during the last time interval $T_5$ filament energy $E_5$ is:

$$E_5 = T_5(V_{in} + V_d)^2/R_f,$$

where $V_d$ is the voltage drop across the conducting catch diode 19. By predeterminately establishing the ratio of the number $N_3$ of the turns of the filament secondary winding 14c to the number $N_1$ of turns of transformer primary winding 14a, the proper filament voltage amplitude is obtained and the magnitude of the equivalent filament resistance $R_f$ is established to provide full operating energy to the filament of the energized magnetron load.

Referring now to the coordinated waveforms of FIG. 1c, the load may be placed in the non-conductive condition by shortening the initial time interval $T_1'$, during which switching device 15 conducts, such that the peak negative voltage V across the equivalent magnetron load never reaches the load conduction voltage $(-V_M')$ and magnetron current $I_M'$ does not flow. Thus, at the starting time $t_o'$ of a cycle, switching device 15 is driven into saturation, and the initial filament current $I_{fo}$ flows (waveforms (a) and (c) of FIG. 1c). The initial inductance current $I_L'$ begins to lineally increase, and continues to lineally increase throughout all of the shortened initial time interval $T_1'$. Thus, at time $t_1$, at the end of the initial time interval, the mutual inductance current $I_L'$ (waveform (b) of FIG. 1c) reaches a peak current $(I_p' - I_{fo})$, less than the peak current $(I_p - I_{fo})$ in the conductive load case of FIG. 1b, and the maximum current going through switching device 15 is the sum of the equivalent filament resistance and mutual inductance currents, i.e. $I_p'$. At time $t_1'$, base drive circuit removes base drive $I_b$ and device 15 enters the cut-off condition, whereby collector current $I_Q$ ceases to flow. The duration $T_1'$ of the initial interval is substantially established by selection of a peak negative voltage $(-V_p)$, which is to subsequently appear as a positive voltage across the load but be less than the conduction voltage thereof. Having selected the peak ringing voltage $V_p$, the initial time interval $T_1'$ is established in accordance with the formula $$T_1' = (L'/V_1)\left(\sqrt{V_p^2 - V_1^2} / \sqrt{L'/C'}\right)$$

where $V_1$ is $(V_{in} - V_{sat})$. During the shortened time interval $T_1'$ required for preventing the load voltage from reaching the minimum load-conducting voltage, the equivalent filament resistance receives energizing energy $E_1' = T_1' V_1^2/R_f$.

Immediately after switching device 15 is placed in the cut-off condition, the primary voltage V begins to rise, in the negative polarity direction, but does not reach a magnitude sufficient to cause the load to conduct. Typically, the $L'$ $C'$ resonant circuit is relatively lightly damped by the equivalent filament resistance, as the magnitude of resistance $R_f$ is relatively high. Ringing occurs for a time interval $T_x$, of duration given by the formula $$T_x = \sqrt{L'C'} \ (2\sin^{-1}(V_1/V_p) + \pi).$$

The filament equivalent resistance continues to receive energy during this time interval. At some time $t_x$, at the end of ringing time interval $T_x$, voltage V is again equal to input voltage magnitude $V_{in}$. Immediately thereafter, the collector-emitter voltage across device 15 assumes a negative polarity and catching diode 19 conducts, to remove the last of the energy stored in mutual inductance $L'$, during a final time interval $T_5'$ of the cycle. Thus, at time $t_5'$ all of the currents and voltages have returned to their initial values and a second cycle can commence upon reapplication of base drive to switching device 15 from base drive circuit 40. During the entire aforementioned cycle, during which the load device is nonconductive, the load device filament still receives energizing voltage from its associated filament winding 14c, although both the magnitude of the voltage and the total energy supplied to the filament is less than the respective magnitudes supplied thereto during an operating cycle with the load in the conductive condition. However, the filament voltage and total energy is typically of sufficiently large magnitude as to maintain the filament at a sufficient temperature whereby, upon lengthening of the switching device saturation time interval $T_1$, the load may immediately enter the conductive cycle, without deleterious effects upon the filament-cathode structure of the load magnetron.

It will be seen that switching device 15 is subject to approximately a voltage of about $V_{in} + V_M'$, which relatively high voltage may be on the order of 350 volts, when 120 VAC power mains voltage is rectified and utilized for input voltage $V_{in}$. Additionally, switching device must conduct relatively high peak current, e.g. on the order of 50 amperes for 600 watts RF output. It will be seen that over-voltage and over-current protection is highly desirable for a switching device stressed in this manner. Therefore, comparators 30 and 32 act to reduce the switching device conduction time interval $T_1$ (or $T_1'$) if the peak device current $I_Q$ begins to approach the maximum device current, or if the voltage across the device approaches the maximum voltage therof. It will also be seen that the magnitude of emitter resistance 34 must be relatively low, to prevent the voltage drop thereacross from increasing to a level at which switching device 15 is prematurely turned off. As it is desirable to operate base drive circuit 40 and first and second comparators 30 and 32 at an operating potential consistent with solid-state devices, e.g. in the range of 5-25 volts D.C., the emitter resistance 34 must have a magnitude less than several tenths of an ohm, to provide a sufficiently low voltage drop thereacross when device 15 conducts a peak current on the order of 50 amperes.

Figure 2:
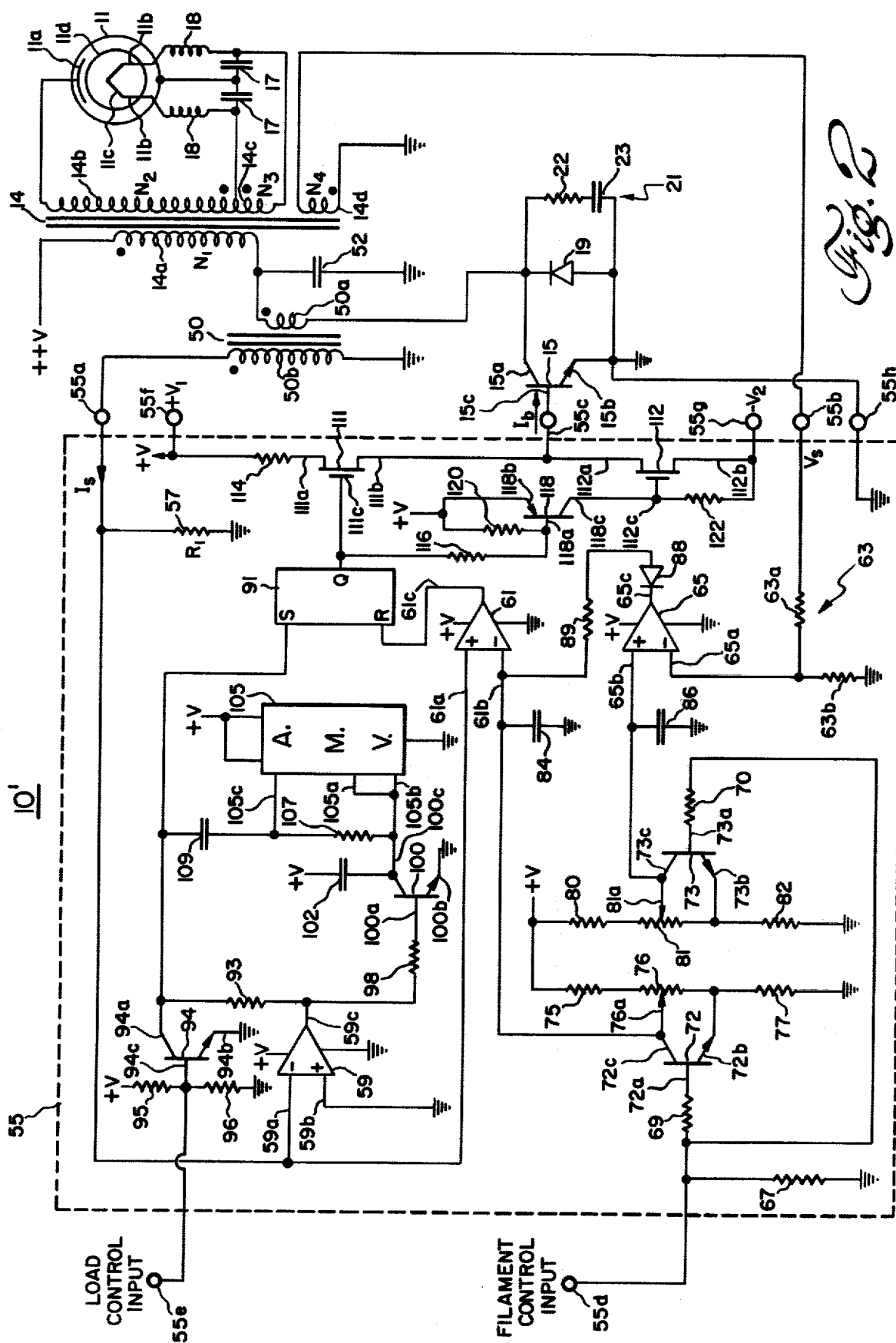
FIG. 2 is a schematic diagram of a base drive and dual comparator circuit suitable for use in the power supply in FIG. 1.

Referring now to FIG. 2, a presently preferred embodiment 10' of our improved power supply is illustrated. In this figure, wherein like reference designations are utilized for like elements, the peak current is sensed by use of a current transformer 50, having a primary winding 50a series connected between that end of power transformer primary winding 14a farthest from the input voltage end, and the junction of switching device collector 15a, the cathode of catching diode 19, and snubbing network 21. Optionally, snubbing resistor 22 can be removed and capacitor 23 moved to the primary winding, as capacitance 52 connected between current transformer primary winding 50a and power transformer primary winding 14a, to be effectively in parallel connection across the flyback power transformer primary winding mutual inductance. It should be understood that the circuit of FIG. 2 is shown with the power supply negative connected to ground potential, but may in actual practice utilize a floating supply of operating potential, having a more positive voltage lead connected to the upper end of power transformer primary winding 14a (the $++V$ input thereof) and having a more negative voltage lead connected in parallel to all of the ground potential symbols illustrated in FIG. 2. Further, it should be understood that, while magnetron 11 is illustrated as having the electrodes thereof floating at various voltages from ground, personnel safety considerations may dictate that the magnetron anode 11a (and the associated end of high-voltage secondary winding 14b) be connected to ground potential. It should also be understood that additional resonating capacitance 52 may or may not be actually utilized, dependent upon the value of effective capacitance C' (see FIG. 1a) desired, and the actual capacitance contributed by the load.

Voltage comparator 30, current comparator 32 and base drive circuit 40 (FIG. 1) may be combined into circuitry 55 enclosed within the broken line portion of FIG. 2, which may be physically provided by an integrated or hybrid circuit. The current comparator first input 32a, voltage comparator first input 30a, base drive circuit output 40d and duty-cycle control inputs 40c of the FIG. 1 circuit respectively correspond to circuit 55 terminals 55a, 55b, 55c and the pair of control inputs 55d and 55e for filament and load control respectively. To provide a voltage comparator input signal of magnitude consistent with amplitudes utilizable with solid-state control circuitry, the voltage comparator signal at input 55b is obtained from a voltage-sensing winding 14d on the power transformer. This winding is provided with a number $N_4$ of turns, which is generally less than the number $N_1$ of turns on transformer primary winding 14a, to step-down the several hundred volts of primary winding potential (which would appear at voltage comparator input 30a of FIG. 1) to a potential having a peak voltage on the order of 10 volts.

Control circuit 55 includes a first resistance 57, of value $R_1$, connected between current sensing input terminal 55a and ground potential, thereby appearing in electrical parallel connection across the current transformer secondary winding 50b. The secondary current $I_s$ flows into input terminal 55a and thence through resistance 57, whereby a voltage appears across resistance 57 with magnitude equal to the product of the magnitudes of resistance $R_1$ and sensed current $I_s$. This voltage is connected to the inverting input 59a of a first operational amplifier 59, having a non-inverting input 59b connected to ground potential. The voltage appearing across resistance 57 is also connected to the non-inverting input 61a of a second operational amplifier 61. The voltage waveform at voltage comparator input terminal 55b, of magnitude $V_s$, appears across a voltage devider 63, having a pair of resistances 63a and 63b connected between terminal 55b and ground potential. The output of voltage divider 63, at the junction between resistances 63a and 63b, is connected to an inverting input 65a of a third operational amplifier 65. All of operational amplifiers 59, 61 and 65 have an operating potential return connected to ground potential and a positive operating lead connected to a positive voltage $+V$, provided at a positive operating potential input 55f, of circuit 55, at which a voltage of magnitude $+V_1$ appears. A negative operating potential, of magnitude $-V_2$, is coupled to another operating potential input terminal 55g, for use as hereinbelow described, while a ground potential terminal 55h is connected to the switching device emitter 15b.

The filament control voltage at filament control input 55d appears across an input resistance 67. Filament input control terminal 55 is also connected to one lead of each of a pair of base resistances 69 and 70, respectively having the opposite leads thereof connected to the base electrodes 72a and 73a, respectively, of first and second transistors 72 and 73. A first voltage divider string comprises a fixed resistance 75, in series with a first potentiometer 76 and a second fixed resistance 77, between positive operating potential $+V$ and ground potential. A second voltage divider string includes first fixed resistance 80 in series with a second potentiometer 81 and a second fixed resistance 82, between positive operating potential $+V$ and ground potential. The emitter electrode 72b of first transistor 72 is connected to the junction between potentiometer 76 and fixed resistance 77 of the first resistance divider string, while the emitter electrode 73a of second transistor 73 is connected to the junction between potentiometer 81 and fixed resistance 82 of the second resistive divider string. The respective collector electrodes 72c and 73c of respective transistors 72 and 73 are respectively connected to the adjustable contact 76a and 81a of the first and second potentiometers. First transistor collector electrode 72c is connected to second operational amplifier inverting input 61b, while second transistor collector electrode 73c is connected to third operational amplifier non-inverting input 65b. A first capacitance 84 is connected between first transistor collector electrode 72c and ground potential, while a second capacitance 86 is connected between transistor collector electrode 73c and ground potential. The cathode of a first diode 88 is connected to third operational amplifier output 65c, while the anode of diode 88 is connected through a resistance 89 to the inverting input 61b of second operational amplifier 61. The second operational amplifier output 61c is connected to a reset R input of a set-reset flip-flop logic element 91. The second operational amplifier inverting input 61b is connected to the anode of a second diode 93, having its cathode connected to a set S input of flip-flop logic element 91. The first operational amplifier output 59c is connected through a resistance 93 to the set S input of flip-flop logic element 91, as is the collector electrode 94a of a third transistor 94. The third transistor emitter electrode 94b is connected to ground potential and the third transistor base electrode 94c is connected to load control input 55e. A resistance 95 is connected between positive operating potential +V and the third transistor base electrode 94c, while another resistance 96 is connected between third transistor base electrode 94c and ground potential. First operational amplifier output 59c is also connected through a base resistor 98 to the base electrode 100a of a fourth transistor 100. An emitter electrode 100b of transistor 100 is connected to ground potential. A collector electrode 100c of transistor 100 is connected to one terminal of a capacitance 102, having its other terminal connected to positive operating potential +V. Fourth transistor collector electrode 100c is also connected to the trigger and threshold inputs 105a and 105b of a timing integrated circuit 105, similar to the well-known 555 or 7555 integrated timing circuits and the like. Circuit 105 is connected between positive operating potential +V and ground potential. A timing circuit output 105c is connected via a resistance 107 to timing circuits inputs 105a and 105b, and through a capacitance 109 to the set S input of flip-flop logic element 91.

A pair of output driving devices 111 and 112, which are illustratively of the power-MOSFET type, have their output, e.g. drain-source, circuits connected in series with a current-limiting resistance 114, between the positive operating supply voltage at circuit input 55f and the negative supply voltage at circuit input 55g. Thus, current limiting resistance 114 is connected between terminal 55f and the drain electrode 111a of first device 111, while first device source electrode 111b is connected to second device drain electrode 112a, and second device source electrode 112b is connected to negative supply terminal 55g. The junction between first device source electrode 111b and second device drain electrode 112a is connected to output 55c and thence to switching device base electrode 15c. The first device input, e.g. gate electrode 111c, is connected to the true Q output of flip-flop logic element 91, which is also connected through a resistance 116 to the base electrode 118a of a fifth transistor 118. Another resistance 120 is connected between fifth transistor base electrode 118a and positive operating potential +V, to which potential is also connected the emitter electrode 118b of the PNP device 118. A fifth transistor collector electrode 118c is connected to second output device input, e.g. gate, electrode 112c, which is also connected through a resistance 122 to the source electrode 112b thereof.

In this illustrated embodiment, load control input 55e is an on-off control, which energizes the load when terminal 55e is connected to ground potential and turns off power supply 10' when terminal 55e is allowed to float, i.e. is disconnected from ground potential. If terminal 55e is at ground potential, control input terminal 55d operates the load at full power when grounded, and operates the load in the non-conductive condition, but with filament power applied, when terminal 55d is allowed to float, i.e. is disconnected from ground potential. Therefore, a pulse-width-modulated signal at input 55d from known circuitry (not shown) will control the load average power. Bias resistances 95 and 96 are predeterminately selected to cause third transistor 94 to be saturated when load control input terminal 55e is open circuited. Saturation of third transistor 94 provides substantially a ground potential at the set S input of flip-flop logic element 91 and prevents the Q output thereof from assuming the high logic level. Conversely, when load control input terminal 55e is grounded, third transistor 94 is placed in the cut-off condition and the flip-flop logic element set S input can be driven to a high logic level to cause the Q output to assume a high logic level. Whenever the flip-flop logic element Q output voltage rises to a high logic level, first output device 111 is turned on to provide a flow of base current $I_b$ into switching device base electrode 15c. Therefore, the switching device is turned on, as at time $t_o$ or $t_o'$ of respective FIGS. 1b or 1c. The magnitude of forward base drive current $I_b$ is established by the magnitude of the positive operating potential $+V_1$, the drain-source saturation voltage drop of the device 111 and by the magnitude of resistance 114.

Upon receipt of a high logic level signal at the reset R input, the flip-flop logic element Q output returns to a low logic level, turning off first output device 111. Simultaneously, fifth transistor 118 is saturated, to turn on second output device 112, thereby substantially connecting switching device base electrode 15c to the negative operating potential $-V_2$. This application of reverse base drive causes stored charge to be rapidly removed from switching device 15, allowing the switching device to rapidly enter the cut-off condition, as required at the end of the first time interval $T_1$, or $T_1'$, of each power supply cycle. Thus, by properly establishing the time interval between positive high logic level signals at the set S and reset R inputs, the switching transistor conduction time interval can be established to either cause the load device 11 to receive a sufficiently high voltage for conduction, or a lesser load voltage for a nonconductive condition. Further, damage to switching device 15 by excessive flow of collector current, or by over-voltage, can be prevented by sensing either condition to cause a high logic level to appear at the reset R input to cause the switching device to turn off.

Thus, operation of power supply 10' commences with the connection of load control input terminal 55e to ground potential, thereby causing third transistor 94 to be in the cut-off condition. Timing integrated circuit 105 and the associated timing resistance 107 and timing capacitance 102 form an astable multivibrator (AMV), which provides a square-waveform signal at output 105c. With third transistor 94 in the cut-off condition, the square-waveform signal is coupled by capacitance 109 to the flip-flop set S input. Accordingly, the first positive transition of the AMV square-waveform received at set S input causes the Q output to obtain a high logic level and turn on first output device 111 and switching device 15, as previously described hereinabove. The current flowing through the series-connected primary windings 50a and 14a, of the respective current-sensing transformer 50 and the power transformer 14, now increases. Accordingly, the current $I_s$ flowing through the current-sensing transformer secondary winding 50b and through resistance 57 also increases, whereby the voltage across resistance 57 proportionally increases. First operational amplifier 59, configured for reverse conduction protection, receives the positive voltage across resistance 57 and maintains the voltage at the output 59c thereof at a low voltage level, maintaining fourth transistor 100 in the cut-off condition, whereby operation of the AMV, formed around timing circuit 105, continues in uninterrupted fashion. The voltage across resistance 57 is also applied to non-inverting input 61a of the second operational amplifier 61. When the collector current becomes sufficiently large that the voltage at third operational amplifier non-inverting input 61a exceeds the voltage at the inverting input 61b thereof, across capacitance 84, the third operational amplifier (over-current comparator) output 61c voltage changes from a low level to a high level, resetting flip-flop logic element Q output and turning off switching device 15 to remove current flow therethrough. With switching device 15 turned off, the resonant flyback power circuit will ring to provide a high voltage to the load magnetron anode. In the last time interval $T_5$, or $T_5'$, of the power supply cycle, catch diode 19 is forward-biased and a current flows through current-sensing transformer primary winding 50a in a direction opposite to the current flow during the initial portion of each power supply cycle. Accordingly, the current-sensing transformer secondary winding current $I_s$ flows in the direction opposite to arrow $I_s$ and a voltage of negative polarity occurs across resistance 57. The negative polarity voltage appears at first operational amplifier inverting input 59a and causes the output 59c thereof to switch from a low logic level to a high logic level. The high logic level at the first operational amplifier (reverse conduction comparator) output 59c is coupled, through resistance 93, to the flip-flop logic element set S input, causing the Q output to change to the high logic level state and switch device 15 into its conductive state, beginning a next subsequent power supply cycle. Thus, operational amplifier 59 is utilized to assure that switching device 15 will only turn on during the conduction interval of catch diode 19, which is a condition essential to low-loss operation of the power supply circuit.

Simultaneous with the application of a high logic level to the set S input by first operational amplifier 59, the high logic level at output 59c thereof also turns on fourth transistor 100 by supplying base drive through resistance 98. Once transistor 100 saturates, timing capacitance 102 is charged to the full operational potential +V. The time constant of the timing circuit (including capacitance 102 and timing resistance 107) is predeterminately selected such that timing capacitance 102 does not discharge to the threshold level required at timing circuit input 105a, typically about two-thirds of the operating potential magnitude, before the next normal turn-on of switching device 15. If however, a reverse conduction signal at first operational amplifier 59c is not received before timing capacitance 102 discharges to the voltage level which enables input 105a, the astable multivibrator will provide a high logic level signal to the set S input and continue operation of the circuit.

The foregoing assumes that the filament control input terminal 55d is at a high logic level, whereby first and second transistors 72 and 73 receive base drive through associated resistance 69 and 70, and are each in their saturated condition. With at least transistor 72 in the saturated condition, the voltage across capacitor 84 is set at a relatively low level. The values of resistances 75 and 77, and the position of potentiometer contact 76a also determined the current level at which the over-current comparator 61 changes output level. Thus, by proper selection of the resistance between first transistor collector electrode 72c and each of positive operating potential +V and ground potential, the peak current flowing through device 15 is set to a safe value.

The values of fixed resistances 80 and 82 and potentiometer 81, and the position of potentiometer contact 81a are selected such that a desired voltage level appears across capacitance 86 when input 55d is connected to +V (filament-only mode). This voltage level, applied to third operational amplifier (over-voltage comparator) non-inverting input 65b, is selected such that the output 65c goes to a low logic level whenever the voltage at third operational amplifier inverting input 65a exceeds the capacitor 86 voltage. This condition obtains whenever the voltage sensed by transformer secondary winding 14d, as further attenuated by resistive voltage divider 63, exceeds a predetermined magnitude, e.g. three kV. Therefore, whenever the load magnetron anode voltage exceeds the third operational amplifier set voltage, e.g. three kV., output 65c is at a low logic level, whereby diode 88 conducts and discharges current from capacitor 84 through resistnace 89. This operation decreases the voltage across capacitance 84, which serves to reduce the current level at which switching device 15 is turned off, thereby controlling the flyback voltage on the load to be the lower load voltage, e.g. three kV., as long as the filament control input terminal 55b is connected to +V. It will be seen that, as the load magnetron device does not receive a sufficiently high voltage for conduction to commence, only filament voltage is applied thereto.

Connection of filament control input terminal 55d to ground potential removes base current drive to first and second transistors 72 and 73, whereby these transistors are in the cutoff condition. The voltage on capacitors 84 and 86 now increase, to potential values estabished by the settings of the first and second potentiometers 76 and 81, respectively. Again, by proper selection of the values of resistances 75, 76 and 77, the power output of the power supply circuit is adjustable by adjustment of the position of potentiometer contact 76a. If the magnetron filament is sufficiently warm when terminal 55d is connected to ground potential, the magnetron will conduct and the flyback voltage will be limited to the magnetron conduction voltage $V_M$. However, if for some reason the filament has not generated sufficient cathode-heating energy to allow load conduction, which condition may obtain if control input terminal 55e was previously connected to ground potential, the over-voltage comparator (operational amplifier 65 and associated components) provides a low logic level at the output 65c thereof and controls the voltage across capacitance 84 reducing the comparator "reference current" input voltage to cause the circuit to flyback to a voltage estabished by the setting of contact 81a of the second potentiometer, which voltage is set to some predetermined maximum, greater than the highest expected magnetron voltage and less than the rating of the transistor 15, until the filament becomes warm enough to allow load magnetron conduction. Thus, during other-than-normal operating conditions of the load magnetron, the over-voltage comparator will limit the flyback voltage on swithing device 15 by limiting the flyback voltage on the load.

Operation of power supply 10' ceases when load control input 55e is disconnected from ground potential, whereby third transistor 94 is saturated and again prevents application of a high logic level to the set S input of flip-flop logic element 91. Fifth transistor 118 and second output device 112 now both conduct, reverse biasing the base-emitter junction of switching device 15 and preventing current flow through the switching device. While the load control input terminal 55e is connected to ground potential, filament control input terminal 55d may be connected to a positive voltage while the circuit 10' is operating at high power level, and the voltages on capacitors 84 and 86 will be rapidly reduced to the filament-only value, assuring filament-only operation of the load. Similarly, the filament control input terminal can be connected to ground potential at any time that load control terminal 55e is grounded, to restore the power supply to full-load-conduction operation.

There has been described an improved power supply of the resonant-flyback-circuit type, having means for providing filament power to a load magnetron directly from the flyback circuit, and having circuit means for driving the output switching device in a controllable fashion, and to prevent application of over-current and/or reverse-conduction and/or over-voltage conditions thereto.

While the present invention has been described with respect to presently preferred embodiments thereof, many variations and modifications will now become apparent to those skilled in the art. Accordingly, we intend to be limited only by the appending claims and not by the specific details presented for the presently preferred embodiments described herein.

What is claimed is:

1. In a power supply of the resonant-flyback type for energizing a self-rectifying load, through which a current flows only when a voltage of predetermined polarity and magnitude is exceeded thereacross, from a secondary winding of a transformer having a primary winding having a mutual inductance to said secondary winding, said primary winding being connected between an operating potential source and a controlled-current path of a switching device, said switching device also having an input terminal for receiving a signal from circuit means for controlling said controlled-current path between conduction of current in a first portion of each of a plurality of operating cycles and essentially non-conduction of current during a remaining portion of each of said operating cycles; and an electrical capacitance effectively connected in parallel across the mutual transformer inductance to resonate said mutual inductance at a frequency greater than the frequency at which said circuit means switches said device; and wherein the load requires a separate source of additional energy even when said current does not flow through said load, the improvement comprising:

an additional secondary winding upon said transformer for supplying said additional energy to said load whenever said power supply is in operation;

means for sensing the magnitude of current flowing through said controlled-current path of said switching device;

over-voltage sensing means including a third transformer secondary winding having a voltage thereacross substantially proportional to the instantaneous voltage appearing across said transformer primary winding;

said circuit means including:

a flip-flop logic element having a set S input, a reset R input and an output providing a signal having first and second levels respectively responsive to the presence of an enabling signal at said set S and said reset R inputs respectively;

first means receiving the flip-flop logic element output signal for respectively enabling and disabling current flow through said switching device controlled-current path responsive to the presence respectively of said first and second output levels;

astable multivibrator means for periodically providing said enabling level signal to said set S input of said flip-flop logic element;

second means for receiving a load control input signal having first and second levels respectively determining if current can or cannot flow through said controlled-current path;

third means coupled to said second means for preventing application of said enabling level signal to said set S input whenever said load control input signal is at said second level;

fourth means for providing an enabling level signal to said reset R input whenever the flow of current in said controlled-current path exceeds a predetermined magnitude, to terminate the flow of current in said controlled-current path whenever said current sensing means senses a current exceeding said predetermined magnitude; and fifth means for reducing said predetermined magnitude of said fourth means whenever the voltage across said transformer third secondary winding exceeds a predetermined value.

2. The improved power supply of claim 1, wherein said first means includes first and second sources of operating potential of opposed polarities; a resistance element; a first semiconductor device having a controlled-current path connected in series with said resistance element between said first operating potential source and said switching device input terminal, and having an input receiving said flip-flop logic element output signal for enabling current flow through said first device controlled-current path responsive only to the presence of said first output level at said flip-flop logic element output; means for inverting the flip-flop logic element output signal; and a second semiconductor device having a controlled-current path connected in series between said switching device input terminal and said second operating potential source, and having an input receiving the output of said inverting means for enabling current flow in said second device controlled-current path responsive only to the presence of said second output level at said flip-flop logic element output.

3. The improved power supply of claim 2, wherein said inverting means comprises a transistor having an emitter electrode connected to said first operating potential source, a base electrode and a collector electrode; a first resistance element connected between said first operating potential source and said base electrode; a second resistance element connected between said base electrode and said flip-flop logic element output; and a third resistance element connected between said collector electrode and said second operating potential source, with the junction between said third resistance element and said collector electrode being connected to said second device input.

4. The improved power supply of claim 1, wherein said third means comprises a semiconductor switching device having an input receiving said load control input signal from said second means and having an output substantially connecting said flip-flop logic element set S input to ground potential responsive to receipt of said load control input signal second level and providing substantially an open circuit between ground potential and said flip-flop logic element set S input responsive to receipt of said load control input signal first level.

5. The improved power supply of claim 1, wherein said fourth means comprises a comparator having a first input receiving the signal provided across said current-sensing transformer secondary winding, another input receiving the reference voltage establishing said predetermined magnitude of current flow, and an output connected to the reset R input of said flip-flop logic element and having said enabling signal level thereat responsive to the signal at said comparator first input exceeding the voltage at said comparator second input.

6. The improved power supply of claim 1, wherein said fifth means comprises a second comparator having a first input receiving at least a portion of the voltage developed across said transformer third secondary winding, a second input receiving a predetermined reference voltage and an output having a voltage appearing thereat normally at a first level and decreasing to a second level whenever the first input voltage exceeds the voltage at said second input; and means coupling the output of said second comparator to said first comparator second input for reducing the voltage thereat whenever said transformer third secondary winding voltage exceeds the voltage at said second comparator second input.

7. The improved power supply of claim 2, wherein said coupling means is comprised of a resistance element having a first terminal connected to said first comparator second input and another terminal; and a unidirectionally-conducting element having a cathode connected to said second comparator output and an anode connected to said resistance element another terminal.

8. The improved power supply of claim 1, further comprising sixth means for receiving an auxiliary control input signal having first and second levels respectively determining if the load voltage will or will not exceed said predetermined magnitude, with said additional secondary winding providing said additional energy to said load regardless of the signal level received by said sixth means as long as said second means receives said load control input signal first level; and seventh means coupled to said sixth means for varying said predetermined magnitude at said fourth means and said predetermined value at said fifth means responsive to the presence of said auxiliary control input second level, to reduce the duration of each time interval during which current flows through said controlled-current path to cause the voltage across said load to be less than said predetermined load conduction magnitude.

9. The improved power supply of claim 8, wherein said seventh means comprises first and second voltage divider means each for providing first and second voltage output levels; means responsive to said first and second auxiliary control input signal levels and connected to said first voltage divider means for switching between said first and second voltage levels to provide a reference having said predetermined magnitude to said fourth means; and another means responsive to said first and second auxiliary control input signal levels and connected to said second voltage dividing means for switching between said first and second voltage levels to provide a reference having said predetermined value to said fifth means; said fourth means providing said enabling signal to said reset R input at said predetermined value if said auxiliary control input first level is present and at another level less than said predetermined magnitude if said auxiliary control input second level is present; said fifth means reducing the predetermined magnitude of a signal at said fourth means another input if said auxiliary control input first level is present and at another value, less than said predetermined value, if said auxiliary control input second level is present.

10. The improved power supply of claim 9, wherein said first and second voltage dividing means each include a first resistance element having a first terminal connected to the first operating potential supply and another terminal, a second fixed resistance element having a first terminal connected to ground potential and another terminal; and a potentiometer having the total resistance thereof connected between said first and second resistance element and other terminals and having an adjustable contact at which said first level is obtained; said second level being obtained at the junction between said potentiometer and said second fixed resistance element.

11. The improved power supply of claim 10, wherein said auxiliary control input responsive means each comprise a semiconductor switching device having an input terminal receiving said auxiliary control input and an output circuit connected between the adjustable contact of the associated potentiometer and the junction between said potentiometer and said second fixed resistance element associated therewith, said output circuit being essentially an open circuit responsive to the presence of said auxiliary control input first level and being substantially a short circuit responsive to the presence of said auxiliary control input second level.

12. The improved power supply of claim 11, wherein said seventh means further comprises first and second capacitive elements, each respectively connected between ground potential and an associated adjustable contact of said first and second potentiometers.

13. The improved power supply of claim 1, further comprising eighth means responsive to a reverse current flow in said current-sensing transformer secondary winding for resetting said astable multivibrator means to provide a set S input enabling level during the flow of reverse current.

14. The improved power supply of claim 13, wherein said eighth means comprises a comparator having a first input connected to ground potential and a second input receiving the signal provided across said current-sensing transformer secondary winding, and an output normally at a first level and changing to a second level responsive to reverse current flow in said current-sensing transformer secondary winding; and a switching device having an input terminal receiving the comparator output level and having an output circuit connected to reinitialize said astable multivibrator means whenever said comparator second output level is present; said astable multivibrator means providing said enabling level signal to said set S input of said flip-flop logic element if not reset by said switching device.

* * * * *